US010506748B2

(12) United States Patent
Klaussner et al.

(10) Patent No.: US 10,506,748 B2
(45) Date of Patent: Dec. 10, 2019

(54) CORONA SHIELDING SYSTEM, IN PARTICULAR OUTER CORONA SHIELDING SYSTEM FOR AN ELECTRICAL MACHINE

(71) Applicant: Siemens Aktiengesellschaft, Munich (DE)

(72) Inventors: Bernhard Klaussner, Nuremberg (DE); Jiri Lang, Nuremberg (DE); Steffen Lang, Hallendorf (DE); Alexander Litinsky, Muelheim (DE); Guido Schmidt, Leichlingen (DE); Christian Schulz-Drost, Nuernberg-Neunhof (DE); Klaus Schaefer, Nuremberg (DE); Christian Staubach, Marl (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 255 days.

(21) Appl. No.: 15/122,271

(22) PCT Filed: Feb. 25, 2015

(86) PCT No.: PCT/EP2015/053911
§ 371 (c)(1),
(2) Date: Aug. 29, 2016

(87) PCT Pub. No.: WO2015/128367
PCT Pub. Date: Sep. 3, 2015

(65) Prior Publication Data
US 2016/0374237 A1     Dec. 22, 2016

(30) Foreign Application Priority Data
Feb. 28, 2014  (DE) .................. 10 2014 203 740

(51) Int. Cl.
| H02K 1/00 | (2006.01) |
| H05K 9/00 | (2006.01) |
| H01B 3/52 | (2006.01) |
| H01B 7/29 | (2006.01) |
| H02K 3/40 | (2006.01) |
| H02K 3/30 | (2006.01) |

(52) U.S. Cl.
CPC ............. *H05K 9/0073* (2013.01); *H01B 3/52* (2013.01); *H01B 7/292* (2013.01); *H02K 3/30* (2013.01); *H02K 3/40* (2013.01)

(58) Field of Classification Search
CPC .............. H02K 3/40; H02K 3/30; H01B 3/04
USPC .......................................... 310/196; 29/596
See application file for complete search history.

(56) References Cited

U.S. PATENT DOCUMENTS

| 4,207,482 | A | * | 6/1980 | Neumeyer ............. H01B 3/004 174/DIG. 22 |
| 4,760,296 | A | | 7/1988 | Johnston et al. ................ 310/45 |
| 5,723,920 | A | * | 3/1998 | Markovitz ............... H02K 3/40 310/201 |
| 6,043,582 | A | * | 3/2000 | Markovitz ............... H02K 3/30 310/196 |
| 6,469,611 | B1 | | 10/2002 | Kluge-weiss et al. .......... 338/20 |
| 6,780,457 | B2 | | 8/2004 | Baumann et al. ............ 427/118 |
| 2003/0091735 | A1 | | 5/2003 | Baumann et al. ............ 427/180 |
| 2005/0048209 | A1 | | 3/2005 | Drappel ..................... 427/372.2 |
| 2005/0194551 | A1 | | 9/2005 | Klaussner et al. .......... 250/505.1 |
| 2006/0097600 | A1 | * | 5/2006 | Baumann ............... H02K 3/345 310/196 |
| 2006/0266488 | A1 | | 11/2006 | Doherty et al. ............ 162/164.1 |
| 2007/0114704 | A1 | | 5/2007 | Stevens et al. ................ 264/643 |
| 2007/0117911 | A1 | | 5/2007 | Irwin et al. ..................... 524/495 |
| 2007/0149073 | A1 | | 6/2007 | Klaussner et al. .............. 442/59 |
| 2008/0152898 | A1 | | 6/2008 | Donzel et al. ................ 428/323 |
| 2008/0179077 | A1 | | 7/2008 | Krivda et al. ............. 174/152 R |
| 2008/0284262 | A1 | * | 11/2008 | Nelson ....................... C08J 5/10 310/52 |
| 2012/0286825 | A1 | | 11/2012 | Bans et al. ....................... 327/39 |
| 2013/0260139 | A1 | | 10/2013 | Kamada et al. .............. 428/328 |
| 2014/0083592 | A1 | | 3/2014 | Gröppel et al. ................. 156/53 |
| 2014/0246628 | A1 | * | 9/2014 | Anhalt ..................... C08K 7/00 252/500 |

FOREIGN PATENT DOCUMENTS

| CN | 1266534 | A | 9/2000 | ............... H01C 7/10 |
| CN | 1992100 | A | 7/2007 | ............. B05C 19/00 |
| CN | 101189686 | A | 5/2008 | ............... H01B 3/08 |
| CN | 101253582 | A | 8/2008 | ............. H01B 17/28 |
| CN | 103029395 | A | 4/2013 | ............. B32B 27/18 |
| CN | 103400638 | A | 11/2013 | ............. C09J 11/04 |
| DE | 102010000962 | A1 | 7/2011 | ............... G06F 1/04 |
| DE | 102010009462 | A1 | 9/2011 | ............... H02K 3/40 |
| DE | 102010032949 | A1 | 2/2012 | ............. H01B 19/04 |
| DE | 102011075425 | A1 | 11/2012 | ............. H02K 15/10 |
| EP | 2362399 | A1 | 8/2011 | ............... H01B 3/02 |
| GB | 1169946 | A | 11/1969 | ............... C09J 7/02 |
| GB | 2115396 | A | 9/1983 | ............. C04B 20/10 |
| JP | 4946101 | A | 5/1974 | ............. H01B 17/00 |
| JP | 5613605 | A | 2/1981 | ............... C08K 3/00 |
| JP | 5681054 | A | 7/1981 | ............... H02K 3/40 |
| JP | 58161205 | A | 9/1983 | ............. C04B 20/10 |
| JP | 58190246 | A | 11/1983 | ............... H02K 3/40 |
| JP | 61177134 | A | 8/1986 | ............... H02K 3/40 |

(Continued)

OTHER PUBLICATIONS

Chinese Office Action, Application No. 201580010152.2, 12 pages, dated Mar. 1, 2017.

(Continued)

*Primary Examiner* — Hanh N Nguyen
(74) *Attorney, Agent, or Firm* — Slayden Grubert Beard PLLC

(57) ABSTRACT

A corona shielding system for an electric machine, for example a high-voltage machine, such as a generator, for generating electrical energy, an electric motor or else other electric operating means having a relatively high rated voltage, such as transformers, bushings, cables, etc, is disclosed. The corona shielding system may include a filler mixture including both planar and spherical particles. Therefore, the electrical conductivity, which is good in the presence of only planar particles in two spatial directions but is very poor in the third, can be adjusted anisotropically in a targeted manner.

10 Claims, No Drawings

(56) References Cited

FOREIGN PATENT DOCUMENTS

| | | | | |
|---|---|---|---|---|
| JP | 6277040 | A | 4/1987 | ............. H02K 15/12 |
| JP | 1028345 | A | 1/1998 | ............. H02K 15/12 |
| JP | 2005080468 | A | 3/2005 | ............... H02K 3/34 |
| JP | 2007174816 | A | 7/2007 | ............. H02K 15/10 |
| JP | 2008544455 | A | 12/2008 | ............. H01B 17/60 |
| JP | 2011223874 | A | 11/2011 | ............... H02K 3/40 |
| RU | 2002120494 | A | 2/2004 | ............. H02K 15/12 |
| SU | 553322 | A1 | 4/1977 | ............. D21H 23/00 |
| WO | 03/107512 | A1 | 12/2003 | ............... G21K 1/00 |
| WO | 2005/124790 | A2 | 12/2005 | ............... C08K 3/22 |
| WO | 2006/118536 | A1 | 11/2006 | ............... H01B 3/08 |
| WO | 2012/152262 | A1 | 11/2012 | ............... C08K 3/00 |
| WO | 2015/128367 | A1 | 9/2015 | ............... H01B 3/52 |
| WO | 2015/128432 | A1 | 9/2015 | ............... H01B 7/29 |

OTHER PUBLICATIONS

Russian Office Action, Application No. 2016134750/07, 6 pages, dated Nov. 15, 2017.
Japanese Office Action, Application No. 2016554458, 2 pages, dated Dec. 4, 2017.
Russian Office Action, Application No. 2016134746/07, 9 pages, dated Dec. 5, 2017.
International Search Report and Written Opinion, Application No. PCT/EP2015/054070, 22 pages, dated May 18, 2015.
International Search Report and Written Opinion, Application No. PCT/EP2015/05311, 10 pages, dated Jun. 22, 2015.
Japanese Office Action, Application No. 2016554459, 3 pages, dated Oct. 2, 2017.
Chinese Office Action, Application No. 201580010406.0, 8 pages, dated Sep. 18, 2018.
Chinese Office Action, Application No. 201580010406.0, 6 pages, dated Jan. 17, 2018.
Indian Office Action, Application No. 201617025340, 5 pages, dated Feb. 13, 2019.
U.S. Non-Final Office Action, U.S. Appl. No. 15/122,254, 25 pages, dated Jan. 10, 2019.
U.S. Final Office Action, U.S. Appl. No. 15/122,254, 21 pages, dated Jul. 23, 2019.

* cited by examiner

CORONA SHIELDING SYSTEM, IN PARTICULAR OUTER CORONA SHIELDING SYSTEM FOR AN ELECTRICAL MACHINE

CROSS-REFERENCE TO RELATED APPLICATIONS

This application is a U.S. National Stage Application of International Application No. PCT/EP2015/053911 filed Feb. 25, 2015, which designates the United States of America, and claims priority to DE Application No. 10 2014 203 740.9 filed Feb. 28, 2014, the contents of which are hereby incorporated by reference in their entirety.

TECHNICAL FIELD

The invention relates to a corona shielding system for an electrical machine, for example a high-voltage machine, such as a generator for generating electrical energy or an electric motor, but also other electrical equipment with a higher rated voltage such as transformers, bushings, cables, etc.

BACKGROUND

Ever more powerful machines, such as for example generators, are being developed, because advancing technology demands ever higher power densities. A powerful generator, such as for example a turbo generator, has in particular a stator with a laminated stator core and a plurality of generator slots in which the generator winding is located.

The main insulation of this winding with respect to the laminated core is a system that is subjected to great electrical loading. High voltages occur during operation and have to be brought down in the insulating volume between the conductor bar, which is under a high voltage, and the laminated core, which is at ground potential. Increases in the field thereby occur at the edges of the sheets in the laminated core, which for their part cause partial discharges. When they meet the insulating system, these partial discharges lead locally to very intense overheating. In this case, the organic materials of the insulating system, including those of the outer corona shielding system, are successively broken down into low-molecular, volatile products, for example $CO_2$.

An important component part of the insulating system is the so-called outer corona shielding (OCS). In the case of relatively large generators and electric motors, it is applied directly to the surface of the winding insulation. The OCS currently consists of tapes or lacquers containing carbon black and graphite.

Since, for system-related reasons, the interface between the OCS and the main insulation especially cannot be produced completely without pores, correspondingly high electrical field intensities in the insulating system cause correspondingly high electrical partial discharge activity, which during operation completely incinerates the outer corona shielding over time and consequently leads to premature aging of the insulation and in the worst case to a ground fault of the electrical machine. This corresponds to an irreparable complete failure of the machine.

The outer corona shielding must have a certain square resistance, which lies in a certain range. If it is too low, the laminated cores may be electrically shorted, which can lead to high induced circulating currents, which are manifested over the ends of the laminated core and the outer corona shielding and lead to high-current arcs. If the resistance is too high, high-voltage spark erosion may in turn occur. It would be ideal if the resistance in the outer corona shielding system could be set, so that it would be possible to establish an anisotropy that displays increased conductivity in the radial direction, that is to say from the current-carrying conductor to the laminated core, and increased resistance, that is to say low conductivity, in the direction of the bar.

SUMMARY

One embodiment provides a corona shielding system for an electrical machine, comprising a filler in a polymeric matrix, the filler comprising both planar and spherical particles that are resistant to partial discharges and electrically conductive.

In one embodiment, the polymeric matrix is able to be produced from a thermoset, a thermoplastic and/or an elastomer.

In one embodiment, the particles comprise a core that is resistant to partial discharges with a coating that is resistant to partial discharges and is electrically conductive.

In one embodiment, the spherical particles and the planar particles are contained in the filler approximately in a ratio of 1:3.

DETAILED DESCRIPTION

Embodiments of the present invention may provide a stable corona shielding system.

Some embodiments provide a corona shielding system for an electrical machine, comprising a filler in a polymeric matrix, the filler comprising both planar and spherical particles that are resistant to partial discharges and electrically conductive.

The particles may comprise a core that is resistant to partial discharges and a coating that is resistant to partial discharges and is conductive.

The term "resistant to partial discharges" relates here to materials which—for example—are resistant to oxidation when there are partial discharges in air or which otherwise remain stable when there are partial discharges, such as ceramics and/or glasses.

The polymeric matrix is for example a thermoplastic, a thermoset and/or an elastomer.

According to one embodiment, the core that is resistant to partial discharges is of a ceramic or glass-like material, which preferably has a low density and is preferably mica, silica flour, alumina or glass platelets.

With a planar structure of the particles, improved contacting of the conductive particles with respect to one another is achieved. It is preferred that the material coating the particles is a metal oxide and is selected from the group comprising tin oxide, zinc oxide, zinc stannate, titanium dioxide, lead oxide or non-oxidic silicon carbide. The doping element is preferably selected from the group: antimony, indium and cadmium.

The particle mass concentration of the particles in the carrier matrix may be chosen such that the corona shielding material is above the percolation threshold. It is preferred here that the particle mass concentration of the particles lies above 15% by weight. As from this specific particle mass concentration in the carrier matrix, the composite material is above the percolation threshold and the surface resistance of the corona shielding material scarcely changes with increasing particle mass concentration. As a result, the corona shielding material is scarcely subject to fluctuations in the surface resistance, which as a result can be reproduced well.

One particular aspect of the invention is the mixing of spherical and planar filler particles. It is known from DE 10 2010 009 462.5 that planar platelet-like particles are used for the production of the outer corona shielding, particles which by their alignment during the production process and their conductive coating create conductivity paths, along which the conductivity is high and the resistance is low. A disadvantage of this is that the conductivity perpendicular thereto, that is to say in the radial direction, where the platelet-like particles only have a very small extent, is quite low. As mentioned above, it is specifically in this radial direction however that the conductivity would be desired.

A general finding of the present invention is that, in addition to the outstanding properties of corona shielding with coated planar particles, as known for example from DE 10 2010 009 462.5, a conductivity in the transverse direction in relation to the platelets can be specifically set by adding spherical particles.

The particles may be used in micro size, for example the platelets have a width and length in the micrometer range, that is to say for example in the range of 1 to 300 μm, in particular of 1 to 100 μm and particularly preferably of 1 to 40 μm, whereas their diameter in the thickness direction lies in the nanometer range, that is to say between 50 and 1000 nm, in particular in the range of 100 nm to 1000 nm. The spherical particles have for example a diameter in the range of 0.5 to 50 μm, in particular of 1 to 10 μm.

By adding globular, that is to say spherical, fillers to planar or rod-like fillers, the percolation thresholds of the three spatial directions shift to much lower filler concentrations. As a result and due to the fact that globular fillers have a smaller specific surface than planar particles, the absolute surface area at interfaces in the composite material is reduced significantly, though the system is nevertheless above the percolation threshold. As a result, it is now possible for the first time that such corona tapes melt when exposed to temperature, and in the case of an overlapping winding fuse very well together, and the overlapping produces scarcely any contact resistance. At the same time, this system is and remains very reproducible, since also in this way the electrical resistance can be set above the percolation threshold.

For example, the planar particles are in relation to the spherical particles approximately in a ratio of 3:1.

The adding of globular fillers to planar fillers has the effect of clearly increasing the electrical conductivity perpendicularly in relation to the directed filler platelets, since the small spheres are intercalated between the platelets. As a result, the anisotropic electrical resistance of the corona layer can be adapted within certain ranges.

If the globular particles are likewise produced from a doped metal oxide, they are, like the planar particles already known from the earlier application DE 10 2010 009 462.5, likewise resistant to partial discharges. As a result, the service life of the electrical machine is significantly increased, or it can be operated at higher power.

The general conductivity of such globular fillers can be set by the doping of the metal oxide (by analogy with the planar fillers).

Both fillers preferably have a lightweight carrier substrate.

The planar particles mica, the globular particles silica flour.

This ensures that the fillers produced in this way have a relatively low density, and thus do not settle during processing, since the functional coating on the substrates mentioned consists of doped metal oxides, for example antimony-doped tin oxide, which has a density of 6.9 g/cm$^3$. As a result, the finished fillers with the respective lightweight substrate only have a density of—for example—3.5 g/cm$^3$.

The planar geometry and also the alignment of the filler in the corona shielding perpendicularly to the field loading significantly lengthen the erosion path through the corona shielding in comparison with corona shielding that consists only of globular fillers. For this reason, the amount of spherical particles added to the platelet-like particles has to be selected with the conflicting priorities of increasing the erosion path by having, as far as possible, entirely platelet-like particles and setting an anisotropic conductivity by having globular particles.

The invention relates to a corona shielding system for an electrical machine, for example a high-voltage machine, such as a generator for generating electrical energy or an electric motor, but also other electrical equipment with a higher rated voltage such as transformers, bushings, cables, etc. The corona shielding system is distinguished by a filler mixture in which both planar particles and spherical particles occur. Consequently, the electrical conductivity, which is good in two spatial directions when there are only planar particles but very poor in the third direction, can be specifically set anisotropically.

What is claimed is:

1. A corona shielding system for an electrical machine, the corona shielding system comprising:
    a polymeric matrix;
    a filler dispersed in the polymeric matrix, the filler comprising planar particles and spherical particles;
    wherein the planar particles each comprise a planar core covered by a respective electrically conductive coating;
    the spherical particles each comprise a spherical core covered by a respective electrically conductive coating; and
    a concentration of the particles in the polymeric matrix exceeds 15% by weight of the corona shielding system so the system exceeds a percolation threshold for conductivity of the system along a first axis equivalent to a conductivity of the planar particles along a longest dimension.

2. The corona shielding system of claim 1, wherein the polymeric matrix is produced from at least one of a thermoset, a thermoplastic, or an elastomer.

3. The corona shielding system of claim 1, wherein:
    the core of the planar particles and the core of the spherical particles are both resistant to partial discharges, and
    the electrically conductive coating is resistant to partial discharges and electrically conductive.

4. The corona shielding system of claim 1, wherein the spherical particles and the planar particles are contained in the filler approximately in a ratio of 1:3.

5. An electrical machine, comprising:
    a plurality of machine components; and
    a corona shielding system arranged proximate at least one of the machine components, the corona shielding system comprising:
    a polymeric matrix; and
    a filler dispersed in the polymeric matrix, the filler comprising both planar and spherical particles;
    wherein the planar particles each comprise a planar core covered by a respective electrically conductive coating;
    the spherical particles each comprise a spherical core covered by a respective electrically conductive coating; and wherein a concentration of the particles in the polymeric matrix exceeds 15% by weight of the corona shielding system so the system exceeds a percolation threshold for conductivity of the system along a first axis equivalent to a conductivity of the planar particles along a longest dimension.

6. The electrical machine of claim 5, wherein the polymeric matrix of the corona shielding system is produced from at least one of a thermoset, a thermoplastic, or an elastomer.

7. The electrical machine of claim 5, wherein each of the particles in the filler comprises:
   a core resistant to partial discharges, and
   a coating that is resistant to partial discharges and is electrically conductive.

8. The electrical machine of claim 5, wherein the spherical particles and the planar particles of the corona shielding system are contained in the filler approximately in a ratio of 1:3.

9. The electrical machine of claim 5, wherein the electrical machine is a high-voltage machine.

10. The electrical machine of claim 5, wherein the electrical machine is a generator or an electric motor.

* * * * *